(12) United States Patent
Gurov et al.

(10) Patent No.: US 11,562,888 B2
(45) Date of Patent: *Jan. 24, 2023

(54) GENERATOR WITH CONTROLLABLE SOURCE IMPEDANCE

(71) Applicant: Advanced Energy Industries, Inc., Fort Collins, CO (US)

(72) Inventors: Gennady G. Gurov, Loveland, CO (US); Michael Mueller, Loveland, CO (US); Zebulun Whitman Benham, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/093,333

(22) Filed: Nov. 9, 2020

(65) Prior Publication Data

US 2021/0057189 A1  Feb. 25, 2021

Related U.S. Application Data

(63) Continuation of application No. 16/388,574, filed on Apr. 18, 2019, now Pat. No. 10,840,063.
(Continued)

(51) Int. Cl.
*H01J 37/32* (2006.01)

(52) U.S. Cl.
CPC .. *H01J 37/32183* (2013.01); *H01J 37/32128* (2013.01); *H01J 37/32146* (2013.01)

(58) Field of Classification Search
CPC ........... H01J 37/32082; H01J 37/32183; H01J 37/32211; H01J 37/32174; H01J 37/32146
See application file for complete search history.

(56) References Cited

U.S. PATENT DOCUMENTS

| 5,101,171 A | 3/1992 | Redmond |
| 5,712,592 A | 1/1998 | Stimson et al. |

(Continued)

FOREIGN PATENT DOCUMENTS

| DE | 102013226511 A1 | 6/2015 | |
| DE | 102013226537 A1 | 6/2015 | |
| WO | WO-2015148490 A1 * | 10/2015 | ........ H01J 37/32146 |

OTHER PUBLICATIONS

European Patent Office, "Communication Pursuant to Rules 161(1) and 162 EPC Regarding European Patent Application 19721505.6", dated Nov. 27, 2020, p. 3, Published in: EP.

(Continued)

*Primary Examiner* — Sisay G Tiku
(74) *Attorney, Agent, or Firm* — Neugeboren O'Dowd PC

(57) ABSTRACT

A power supply system controls the source impedance of a generator utilizing two amplifiers having asymmetrical power profiles in reference to a nominal load impedance that are diametrically opposite in reference to the nominal load impedance. Variations in power profiles may be achieved by using different topologies for each of the amplifiers or implementing a phase delay network. The output power from the first and second amplifiers may be combined using a combiner circuit or device and the output power from the combiner is transmitted to a plasma load. The output power of each amplifier may be independently controlled to alter one or more characteristics of the output power signal provided by the individual amplifiers. By changing the ratio of the output power of the first amplifier to the output power of the second amplified, the source impedance of the generators may be varied.

17 Claims, 8 Drawing Sheets

Related U.S. Application Data

(60) Provisional application No. 62/660,893, filed on Apr. 20, 2018.

(56) References Cited

U.S. PATENT DOCUMENTS

| | | | |
|---|---|---|---|
| 7,755,452 | B2 | 7/2010 | Knickerbocker et al. |
| 7,872,523 | B2 * | 1/2011 | Sivakumar ............ H03F 3/2176 330/10 |
| 7,970,037 | B2 | 6/2011 | Hauer et al. |
| 8,354,893 | B2 | 1/2013 | Hauer et al. |
| 9,060,411 | B2 | 6/2015 | Biloiu et al. |
| 9,294,100 | B2 | 3/2016 | Van Zyl |
| 9,853,664 | B2 | 12/2017 | Li et al. |
| 10,026,593 | B2 | 7/2018 | Alt et al. |
| 10,042,407 | B2 | 8/2018 | Grede et al. |
| 11,150,283 | B2 * | 10/2021 | Ulrich ............... H01J 37/32183 |
| 2010/0296977 | A1 | 11/2010 | Hancock |
| 2011/0109393 | A1 | 5/2011 | Adamski et al. |
| 2011/0148303 | A1 | 6/2011 | Van Zyl et al. |
| 2011/0241773 | A1 * | 10/2011 | Fisk .................... H03F 3/68 330/124 R |
| 2014/0155008 | A1 | 6/2014 | Van Zyl |
| 2015/0270104 | A1 * | 9/2015 | Van Zyl ............ H01J 37/32146 315/111.21 |
| 2015/0287576 | A1 | 10/2015 | Grede et al. |
| 2015/0288274 | A1 | 10/2015 | Grede et al. |
| 2016/0299548 | A1 | 10/2016 | Grede et al. |
| 2016/0300695 | A1 | 10/2016 | Alt et al. |
| 2017/0330731 | A1 * | 11/2017 | Van Zyl ............ H01J 37/32183 |
| 2019/0326093 | A1 * | 10/2019 | Gurov ............... H01J 37/32128 |
| 2021/0027992 | A1 * | 1/2021 | Funk .................... H03F 3/602 |
| 2022/0084790 | A1 * | 3/2022 | Van Zyl ............ H01J 37/32183 |

OTHER PUBLICATIONS

Tiku, Sisay, "Office Action Regarding U.S. Appl. No. 16/388,574", dated Jan. 27, 2020, p. 34, Published in: US.

Van Kerckhoven, Ilse, "International Search Report and Written Opinion Regarding International Application No. PCT/US2019/028171", dated Jul. 3, 2019, p. 11, Published in: NL.

European Patent Office, "Communication Pursuant to Rules 94(3) EPC Regarding European Patent Application 19721505.6", dated Apr. 11, 2022, p. 11, Published in: EP.

* cited by examiner

GENERATOR WITH CONTROLLABLE SOURCE IMPEDANCE

CLAIM OF PRIORITY UNDER 35 U.S.C. § 120

The present Application for Patent is a Continuation of patent application Ser. No. 16/388,574 entitled "SYSTEM AND METHOD FOR CONTROL OF HIGH EFFICIENCY GENERATOR SOURCE IMPEDANCE" filed Apr. 18, 2019, which is related to and claims priority under 35 U.S.C. § 119(e) from U.S. Patent Application No. 62/660,893, filed Apr. 20, 2018, titled "SYSTEM AND METHOD FOR CONTROL OF HIGH EFFICIENCY GENERATOR SOURCE IMPEDANCE," the entire content of which is incorporated herein by reference for all purposes.

TECHNICAL FIELD

Aspects of the present disclosure relate to controlling power sources and, in particular, to control of interactions between power sources and plasma loads in plasma processing systems.

BACKGROUND

In the field of semiconductor manufacturing, as well as other fields, a plasma system has various possible uses. For example, plasma-enhanced chemical vapor deposition is a process used to deposit thin films on a substrate using a plasma system. A typical plasma processing system, in high-level terms, involves a processing chamber and a power delivery system that ignites and maintains a plasma inside the chamber. The plasma may be characterized as a load with an impedance that is driven by the power generator. The load impedance of the plasma is typically around 50 Ohms, but it will vary depending on process conditions and other variables. For example, plasma load impedance may vary depending on generator frequency, power, chamber pressure, gas composition, and plasma ignition. These variations in plasma impedance may adversely affect the power delivery from the generator; and may also result in undesired drifts or perturbations in process variables, such as etch or deposition rates, due to changes in the physical properties of the plasma at different power levels. Plasma processing systems equipped with impedance matching mechanisms or circuitry that matches the source impedance of the power delivery system to the plasma load impedance may reduce such adverse effects on the plasma process.

It is with these observations in mind, among others, that aspects of the present disclosure were conceived.

SUMMARY

According to one aspect, a power supply system for providing power to a plasma load includes a first power amplifier including a first amplifier input and a first amplifier output, the first power amplifier having a first controllable output power a first asymmetrical power profile with a first peak power offset in reference to an impedance of a load and a second power amplifier including a second amplifier input and a second amplifier output, the second power amplifier having a second controllable output power a second asymmetrical power profile with a second peak power offset in reference to the impedance of the load. The power supply system may also include a controller in communication with at least one of the first power amplifier and the second power amplifier, the first controllable output power combined with the second controllable output power to define a combined output power, the controller to adjust at least one of the first controllable output power or the second controllable output power to control a source impedance of the combined output power.

According to another aspect, method for operating a plasma processing system is provided. The method may include, in a power supply including a first amplifier providing a first power signal with a first power profile and a second amplifier providing a second power signal with a second power profile, and in response to an impedance measurement of a load, controlling at least one of the first power signal and the second power signal to define a combined output power signal based on the impedance measurement of the load.

According to yet another aspect, a power supply controller includes a processor and a non-transitory memory comprising instructions that, when executed by the processor, are operable to adjust a source impedance of an output signal of a power supply. The instructions are operable to instruct a first power amplifier to alter, based on a determined load impedance of a load coupled to the power supply, an input power signal from a power generator and provide a first variable output power signal with a first power profile and instruct a second power amplifier to alter, based on the determined load impedance of the load, the input power signal from the power generator and provide a second variable output power signal with a second power profile different than the first power profile. The first variable output power signal and the second variable output power signal are combined to generate a combined output power signal transmitted to the load, the combined output power signal comprising a combined power profile and a source impedance based on the load impedance of the load.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. The drawings depict only typical embodiments of the present disclosure and, therefore, are not to be considered limiting in scope.

DETAILED DESCRIPTION

Typical plasma processing systems are driven by a power generator. Controlling the plasma process is provided in real time by variation of two basic parameters of the generator—output power and operational frequency. But for modern plasma processes such two-dimensional power delivery systems cannot provide optimal and stable conditions in the wide range required in many plasma processing conditions. As a result, the need to control an additional fundamental parameter of the power generator in real time—its source impedance—is vital.

Embodiments of the present disclosure provide a power supply system that allows control of the source impedance of the generator in real time, thereby extending the range of operational conditions for plasma processes. In one embodiment of the power generator system, two radio frequency (RF) amplifiers may be utilized having asymmetrical power profiles in reference to a nominal load impedance. The second power amplifier generally has a power profile that is diametrically opposite that of the first power profile in reference to the nominal load impedance. Such variations in power profiles can be achieved in various ways. For example, variations in power profiles may be achieved by, among other things, using different topologies for each of the amplifiers or implementing a phase delay network. The output power from the first and second amplifiers may be combined using a combiner circuit or other device and the combined output power is transmitted to a plasma load. In certain implementations, the output power of each amplifier may be independently controlled to alter one or more characteristics of the output power signal provided by the individual amplifiers. By changing the ratio of the output power of the first amplifier to the output power of the second amplified, the source impedance of the generators may be varied in real time and in response to a load impedance so as to match the source impedance of the power signal to the load with the load impedance.

Figure 1A:
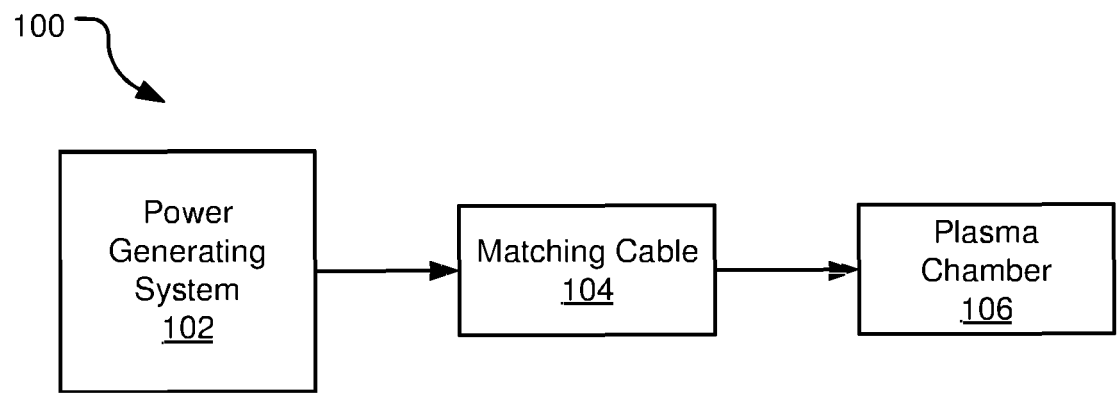
FIG. 1A illustrates a first example plasma processing system.

Typical high efficiency RF generators for plasma generation applications deliver RF power for a wide range of load impedances. For example, FIG. 1A illustrates a first example plasma processing system 100, including a power generating system 102 (such as a high efficiency RF power generator) configured to provide power to a plasma chamber 106. The provided power ignites and sustains a plasma within the plasma chamber 106 for any number and type of plasma processing procedures, such as vapor deposition and etching applications. The power generating system 102 may receive a control signal with a voltage value to control the output power from the power generating system.

Figure 1B:
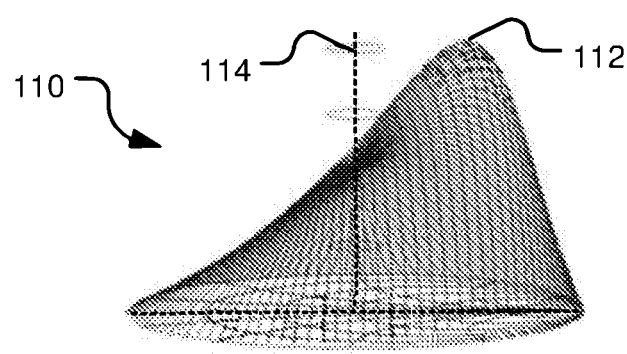
FIG. 1B is a three-dimensional illustration of the output power profile with reference to a nominal load impedance of a high efficiency radio frequency (RF) power generator of a plasma processing system.

Such conventional power generators 102 may produce an asymmetrical output power profile with reference to a nominal load 114. FIG. 1B is a three-dimensional Smith chart (or a reflection coefficient chart) of one example of an asymmetrical output power profile 110 of the RF power generator 102 of the plasma processing system 100. The horizontal plane of the graph 110 represents the active and inactive load impedance components and the vertical axis represents the output RF power. The nominal reference impedance at 50 Ohms is represented in the graph at line 114. The nominal load 114 may be the load impedance of the plasma chamber 106, which is typically around 50 Ohms. However, as explained in more detail below, the load impedance of the plasma chamber 106 may vary depending on process conditions or other variables during the application of the power signal to the load. As can be seen in FIG. 1B, the output power profile 110 of the power generating system 102 is asymmetrical in reference to the nominal reference load 114 as the profile 110 includes a peak power 112 towards the edge of the chart without a corresponding peak power on the opposite side of the chart.

In many plasma processing systems, small variations in load impedance may cause unacceptable variations in the power delivered by the plasma generator 102 and may result in instability of the plasma process 100. For example, fluctuations in the load impedance of the system may cause a mismatch of the source impedance to the load impedance, resulting in the power provided to the plasma to rise or fall due to the asymmetric power profile 110 of the provided power. Although the effects of variations in load impedances may be at least partially absorbed by using a specific length delay line between the power generator 102 and the load 106 (illustrated in FIG. 1A as the matching cable 104 through which the power from the power generating system is provided to the plasma chamber), this type of adjustment in response to the variable nature of the load impedance has a narrow dynamic range and generally cannot be controlled in real time in response to the changes in the plasma process. Another method to match the source impedance to the load impedance is to adjust the source power profile to match a peak power delivery (i.e., the peak of the power profile 112) with the changing impedance. Therefore, real-time control over the source impedance of the power signal may stabilize the plasma processing system.

To provide real-time control over the source impedance of the power signal provided to the load to account for variations in the load impedance of the plasma chamber, alternate high efficiency RF power generating systems are described herein. As mentioned above, matching the output impedance of the power generating system (also referred to as the "source impedance") to an impedance of the load (also referred to as the "load impedance") may improve the operation and efficiency of the plasma processing system. For example, large variations in the load impedance may de-stabilize the plasma processing system, resulting in a shutdown of the system in some instances. Thus, systems and methods for rapidly adjusting a source impedance of a power generation system over a wide range of values in response to a load impedance are provided herein. Such systems may utilize a plurality of RF amplifiers or power generators with asymmetrical output power profiles that may be combined to form an overall output power profile that is transmitted to a load. Aspects or characteristics of the power amplifiers and/or the output power signal from each power amplifier may be controlled by a power control system to adjust or generate a target source impedance of the output power signal in response to measured or determined variations in the load impedance of a load, such as a plasma. Controlling the variations of the power profiles of the multiple power amplifiers may be achieved by, among other things, using different topologies for each of the amplifiers or implementing a phase delay network. The output power from the multiple amplifiers may be combined using a combiner component and the output power from the combiner may be delivered to a plasma load. In certain implementations, the output power signal of each amplifier may be independently controlled by a power control system. By changing the ratio of the output power signal of the first amplifier to the output power signal of the second amplifier, the source impedance of the power signal provided to a load may be varied in real time to match variations in load impedance.

Figure 2:
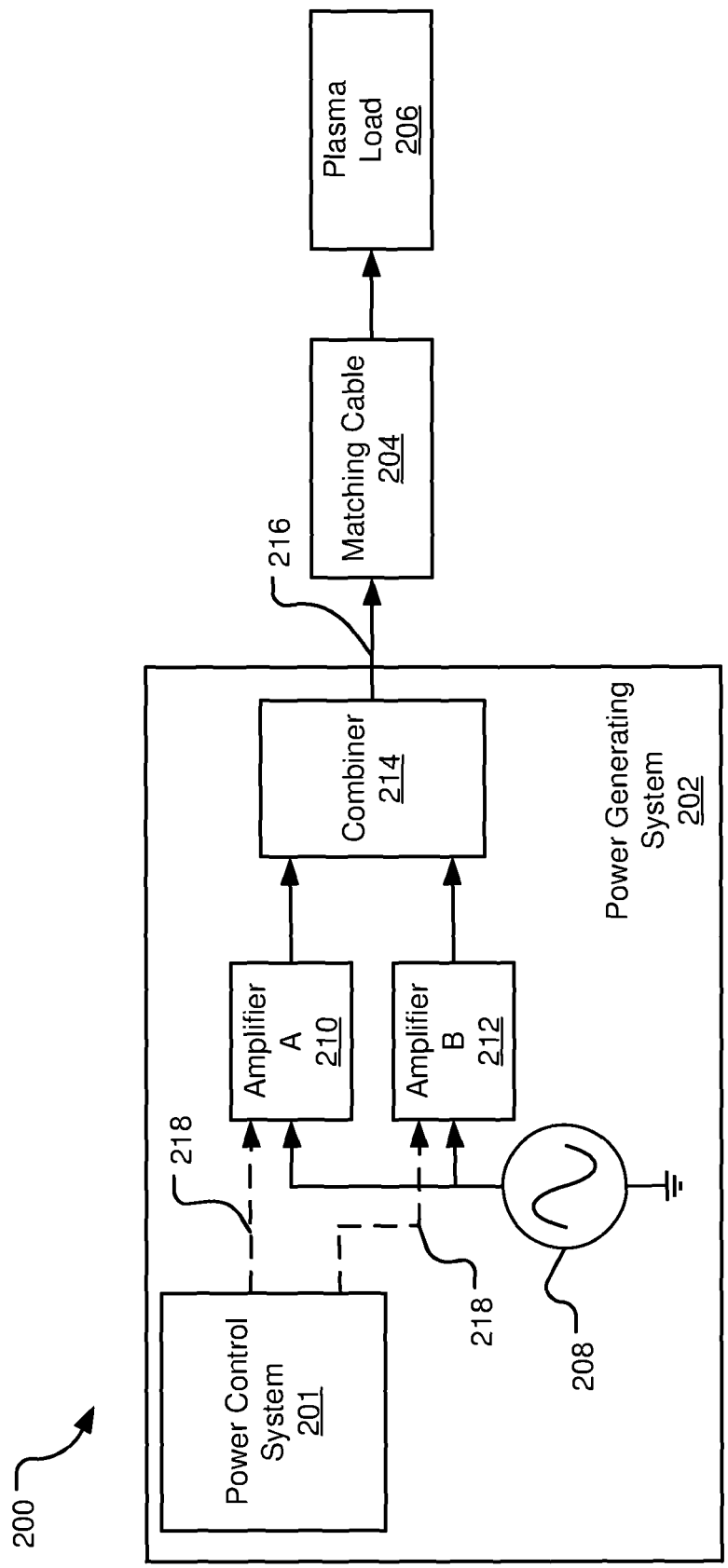
FIG. 2 illustrates a second example plasma processing system with a controllable dual-amplifier high efficiency power generator.

FIG. 2 shows an example plasma processing system 200 with a controllable, dual-amplifier, high efficiency power generator system 202 for providing a power signal with a target source impedance to a load 206. Many of the components of the plasma processing system 200 of FIG. 2 are similar to those described above with reference to FIG. 1A. For example, the system 200 includes a plasma load 206 receiving a high efficiency RF power signal from a power generating system 202 via a matching cable 204. The plasma load 206 and matching cable 204 may operate similarly as described above such that the plasma load may have a load impedance of about 50 Ohms, which may vary due to characteristics or conditions of the system 200. The power generating system 202 of the plasma processing system 200 may include one or more controllable power amplifiers 210, 212 to adjust the output power profile of the power generating system 202 in real time to match the source impedance of the output power signal 216 to the load impedance.

The power generating system 202 of the plasma processing system 200 may include, among other components not illustrated to simplify the discussion, an RF power supply 208, a first amplifier 210, and a second amplifier 212. Each amplifier 210, 212 may receive an output power signal from the power supply 208 and alter the received power signal. Altering the power signal may include adjustment of any characteristic of the power signal, such as adjusting the frequency, amplitude, or phase of the power signal. The output from each amplifier 210, 212 may be provided to a combiner circuit or device 214 configured to combine the two outputs into a single output signal 216. The combined output signal 216 may be provided to the load 206, which may be a plasma chamber or plasma load to conduct plasma processing. In some implementations, each amplifier 210, 212 of the power generating system 202 may be controlled, either together or independently, by power control system 201. For example, power control system 201 may transmit one or more control signals 218 to amplifier A 210 and/or amplifier B 212. The control signals 218 may include one or more instructions to the amplifiers 210, 212 to configure the respective amplifiers to alter the power signal from the power supply 208 to generate a controlled output power signal from the amplifiers. For example, the control signals 218 may configure amplifier A 210 to alter the amplitude of the input power signal from the power supply 208 and provide the altered power signal to the combiner 214. In another example, the control signals 218 may configure or instruct amplifier B 212 to alter the phase of the input power signal from the power supply 208 and provide the altered power signal to combiner 214. As explained in more detail below, changing the ratio of the output power signal of the first amplifier 210 to the output power signal of the second amplified 212 may alter the source impedance of the combined output power signal 216 of the power generating system 202 as provided to the load 206.

Figure 3:
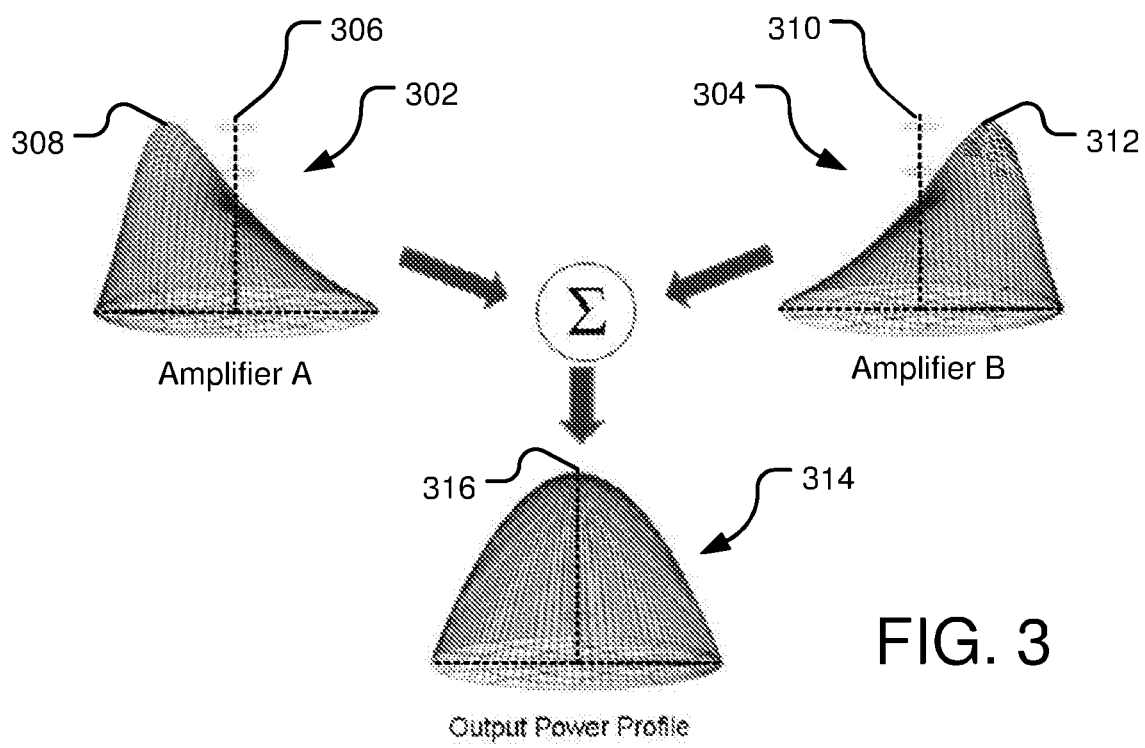
FIG. 3 is a three-dimensional illustration of an output power profile generated from the combination of two power amplifiers with equal output power settings.

As introduced, high efficient RF power generators typically have asymmetrical power profiles with reference to a nominal or reference load. The output power profile of amplifier A 210 and the output power profile of amplifier B 212 may similarly be asymmetrical with reference to a nominal load. In one implementation of the power generating system 202, the control system 201 may deliver the output power signals of amplifier A 210 and amplifier B 212 to provide output power signals with equal amplitudes, but with the output power profile of one amplifier, such as amplifier B, being diametrically opposite of the output power profile of the other amplifier, such as amplifier A. FIG. 3 is a three-dimensional illustration of an output power profile 314 generated from the combination of the output signals of two power amplifiers with equal, but diametrically opposed, output power signals. To generate the output power profile 314 of FIG. 3, the power control system 201 may provide one or more instructions to amplifier A 210 and amplifier B 212 to generate the respective output power profiles for the amplifiers which, when combined by combiner 214, form the combined output power profile 314. In one implementation, the power profile 304 for amplifier B 212 may be diametrically opposed on the Smith chart in relation to the power profile 302 of amplifier A 210. For example, power profile 302 illustrated in FIG. 3 of the amplifier A 210 may be with reference to a nominal load 306, such as 50 Ohms. Similarly, power profile 304 of the amplifier B 212 may be with reference to a nominal load 310, which may also be 50 Ohms. To be diametrically opposed, power profile A 302 may include a peak power 308 that is shown on the left of the nominal load reference 306 and power profile B 304 may include a peak power 312 that is on the right of the nominal load reference 310 of the power profile. The peaks 308, 312 may be equal in height or magnitude, but diametrically opposed in the Smith chart in reference to the nominal load 306, 310. Generating the equal but opposite power profiles 302, 304 may be done by using multiple techniques—such as different topology for the amplifiers 210, 212, phase delay networks, manipulation of the power profile by the control system 201, etc.

FIG. 3 illustrates the combination of the power profiles 302, 304 of the power amplifiers 210, 212 into power profile 314. The combined output power 314 may be provided to a plasma load 206 by the combiner circuit 214. As illustrated, the combined output power profile 314 of amplifier A 302 and amplifier B 304 is symmetrical with a relatively flat peak 316 at the nominal load reference. Control system 201 may control the amplifiers 210, 212 to provide the combined peak power 316 at the nominal load impedance (usually 50 Ohms). However, variations of the load impedance may result in less than the peak power level 316 of the RF power being delivered into the load 206 due to impedance mismatch between load and source.

As illustrated in the power profile 314, the further from the nominal load reference 316 the load impedance becomes, the less power that may be provided to the load from the combined outputs 314 of the amplifiers 210, 212 (from nominal maximum power delivery, as the load impedance moves away from the peak in any direction, it intersects the power profile downward along the profile). In instances when the load impedance varies far from the nominal load impedance, downward along the profile, the plasma processing system 200 may become unstable as the power provided to the plasma load 206 is reduced, which may result in the system shutting down to prevent damage to the system or in response to the plasma collapsing. To maintain optimal power delivery in the presence of changing load conditions, the control system 201 may adjust one or more of the characteristics of the power profiles of the amplifiers 210, 212 to alter the combined profile of the power to the load. In one implementation, the control system 201 may adjust one or more of the characteristics of the power profiles of the amplifiers 210, 212 such that the combined profile of the power to the load has a peak power at or near a determined load impedance. For example, the load impedance may vary during operation of the plasma system away from the nominal load impedance 316 of FIG. 3. In response, the power profile 302 of amplifier A and/or the power profile 304 of amplifier B may be adjusted by the controller to locate the peak power of the power profile of the combined power signal to be located the determined load impedance. In this manner, the peak power (and source impedance) of the combined output power profile 314 may respond to the load impedance.

Figure 4:
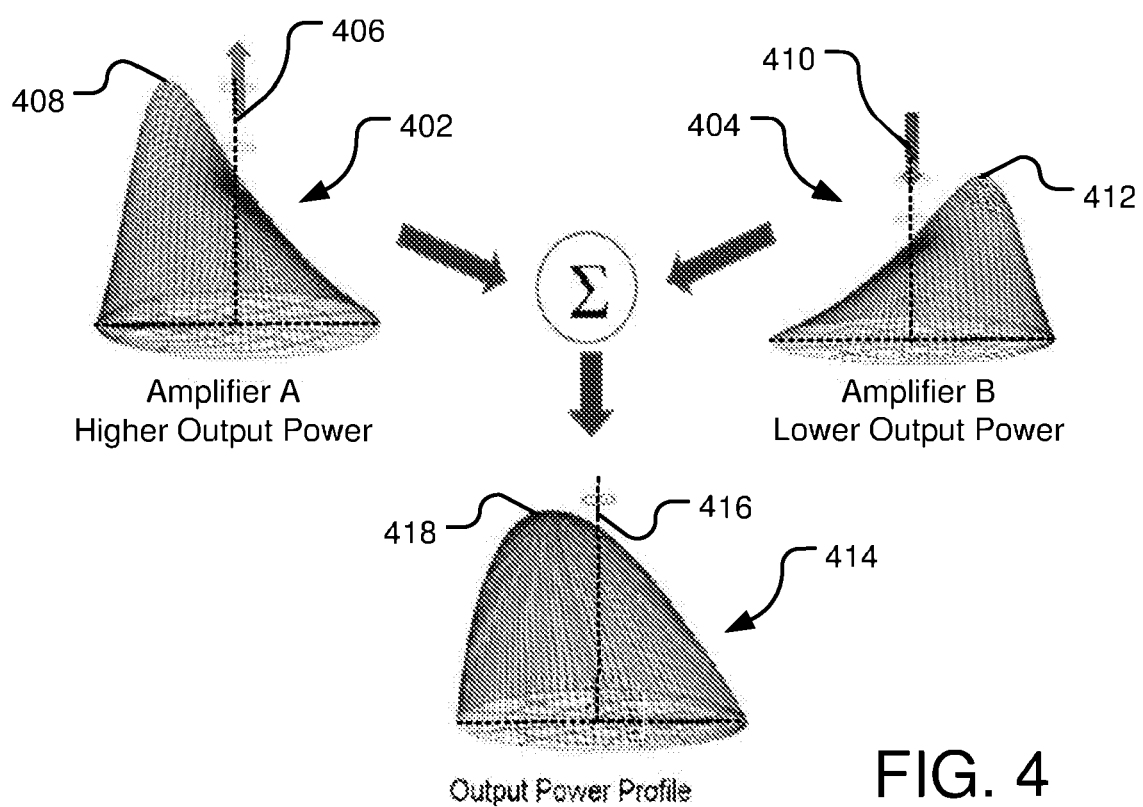
FIG. 4 is a three-dimensional illustration of an output power profile generated from the combination of two power amplifiers with unequal output power settings.

FIG. 4 is a three-dimensional illustration of an example of a combined output power profile 414 generated from the combination unequal output power profiles 402, 404. In particular, the controller may instruct the first amplifier A to generate power with an output power profile 402. The profile 402 is an asymmetrical power profile in reference to a nominal load impedance 406. The controller may instruct the second amplifier B to generate power with an output power profile 404. The profile 404 is also asymmetrical in reference to a nominal load impedance 410. Notably, the peak of power profile A 402 of amplifier A occurs at a different load impedance on the Smith chart than the power profile B 404 of amplifier B. Further, the power profiles 402, 404 have differing peak power magnitudes. The output power profile 404 of the power profiles of amplifier A and amplifier B includes a diametrically opposite peak 412 from the peak 408 location of the output power profile 402. The magnitude of the peak 408 is greater than the magnitude of the peak 412. Thus, unlike the combined profile 314 providing a relatively symmetrical profile about the nominal load impedance 316, the combined output power profile 414 is asymmetrical in reference to the operational load impedance 416. As shown, peak power 418 of the combined profile is to the side of the amplifier A with the greater magnitude peak power. Stated differently, the asymmetrical shape of the combined output power profile 414 is achieved by increasing the amplitude or magnitude of the power profile 402 of amplifier A 210 in relation to the amplitude or magnitude of the power profile 404 of amplifier B 212. This is illustrated in FIG. 4 by the peak 408 of the power profile 402 of amplifier A 210 being higher or taller than the peak 412 of the power profile 404 of amplifier B 212. When combined, the output power profile 414 is asymmetrical in reference to the nominal load impedance 416 such that the peak or maximum power 418 is provided by the amplifiers 210, 212 at a load impedance away from the nominal or reference load impedance. For example, the peak power 418 of the output power profile 414 of the combined power signals may not occur at the nominal load 416. In the presence of a changing nominal load impedance, the controller may adjust the position of the peak power of the combined signal by altering the magnitude or other attribute of the profile of one or both of the amplifier in the combined system. So, for example, if the load impedance had moved from 416 to 418, the controller can adjust the power profiles 402 and 404 to adjust the peak power location 418 to match the change in impedance.

In more detail, as a result of the amplitude mismatch between the output signals 402, 404 of the amplifiers 210, 212, the resulting output power profile 414 when combined is asymmetrical in reference to the nominal impedance 416 such that the peak power delivery point for the source impedance is moved relative to the previous case (shown in FIG. 3) in which each amplifier has an equal output power magnitude. Accordingly, by changing the ratio of the magnitude of the output powers of the two amplifiers 210, 212, the resulting positon of peak power delivery and effectively the source impedance can be adjusted to accommodate different load impedances, and to match changing load impedances. In other words, the value of the generator output or source impedance (or the magnitude of the power profile slope in the provided graphical representations) is controlled by the difference in values of signals from two amplifiers 210, 212. Such changes or control over the output power signals from the amplifiers may be made in real time to account for dynamic variations in load impedance variation, thereby matching the source impedance, controlling power delivery, and improving the controllability and stability of the plasma process. Control of the output of the amplifiers 210, 212 (such as through the power control system 201 providing control signals 218 to the amplifiers to alter the power signal from the power source 208) may thus control the characteristics of the combined output signal 216 provided to the load 206.

Although discussed above with relation to adjusting the magnitude of the power profile from the first amplifier 210 and/or the second amplifier 212, the amplifiers may be controlled by the power control system 201 to alter other characteristics of the power signal from the power source 208 to further generate the combined output power signal 216. For example, the power control system 201 may transmit control signals to the amplifiers 210, 212 to alter the phase of either output to adjust and control the combined output power profile 216. In relation to the power profile graphs of FIGS. 3 and 4, adjusting a phase of the output power profile of amplifier A 210 or amplifier B 212 results in a rotation of the power profile graph about the nominal reference load impedance. This rotation of the power profile provides an additional control over the shape of the combined output power profile 414 to further adjust the combined output power signal 216 provided to the load 206 based on the detected variable load impedance. In general, any aspect of the power profile of output power signal 216 may be controllable by the power control system 201. For example, a target magnitude and/or slope of the power profile 414 of the combined power signals may be determined and generated via the instructions provided to the amplifiers 210, 212 from the power control system 201.

Figure 5:
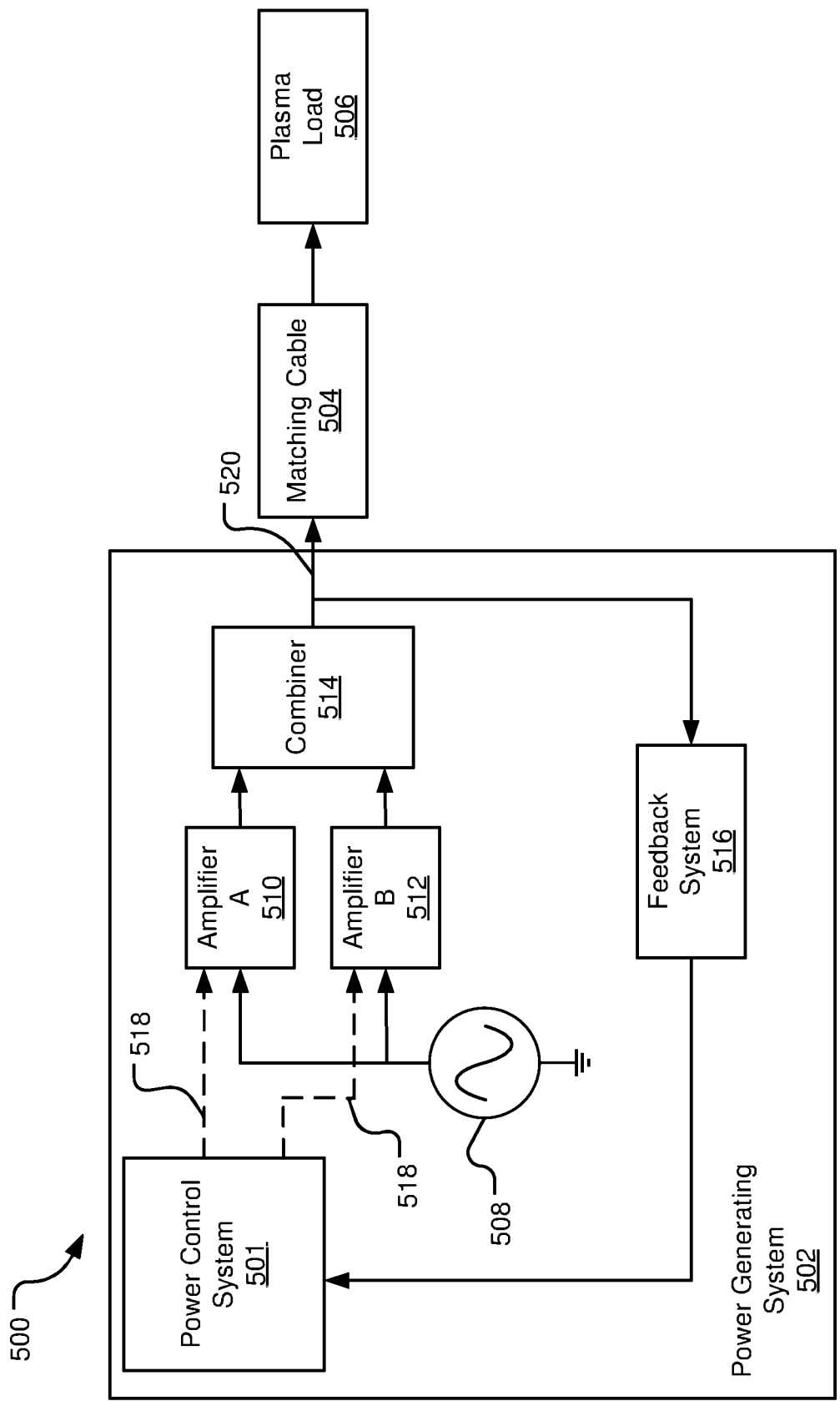
FIG. 5 illustrates a third example plasma processing system with a controllable dual-amplifier high efficiency power generator with phase and impedance feedback control.

The power generating system 202 may control the combined output power signal 216 based on the dynamic variations in load impedance variation to attempt to match the output source impedance to the changing load impedance. In some instances, feedback information and/or measurements from the output power signal 216 and or the load impedance may be provided as an input to the power control system 201 to control the amplifiers 210, 212. For example, FIG. 5 is an example plasma processing system 500 with a controllable dual-amplifier high efficiency power generator 502 with a phase and impedance feedback system 516. Components of the plasma processing system 500 are similar to those described above, with a power generating system 502 providing a power signal to a plasma load 506 via an optional matching cable 504. The power generating system 502 may include a power source 508 providing an input power signal to a first amplifier 510 and a second power amplifier 512, both of which are controllable by a power control system 501 through one or more power control signals 518. In addition to the components described above, the power generating system 502 may also include a feedback system 516. The feedback system 516 may receive the combined output power signal 520 from the combiner circuit 514 and provide information about the combined output power signal 520 (or the combined output power signal itself) to the power control system 501. For example, the feedback system 516 may receive the combined output power signal 520 from the combiner 514 and determine a phase of the combined output power signal, which may be provided the phase to the power control system 501 as an input to the system. The power control system 501 may use the input information, such as the phase of the combined output power signal 520, to control the amplifiers 510, 512 to configure the output power signal in response to the feedback information provided by the feedback system.

In addition, characteristics of the load 506 may also be obtained by or provided to the feedback system 516. For example, the load impedance present at the load may be detected and provided to the feedback system 516, such as with an IV probe. The feedback system 516 may provide the load impedance to the power control system 501, which may adjust the output of amplifier A 510 and/or amplifier B 512 in response to the received load impedance in an attempt to match the source impedance of the output power signal 520 to the load impedance. In some instances, the load impedance (or other characteristics of the load) may be derived from the output power signal 520 to the load 506. For example, the load impedance may vary based on the profile of the power signal 520 to the load. The feedback system 516 may then receive the output power signal 520, analyze the signal to determine load impedance, and provide information of the characteristics of the output power signal to the power control system 501. The power control system 501 may utilize this information to determine how to adjust the output power signals of amplifier A 510 and amplifier B 512 to match the estimated load impedance. In some instances, the power control system 501 may estimate the load impedance from the combined output power signal 520. Similarly, determining the phase of the power signal 520 and the effects of applying the power signal to the load 506 may aid the power control system 501 in adjusting the output power signal in response. Any characteristic that may be controlled by the power control system 501 to shape the power profile of the combined output power signal 520 may be received by the feedback system 516 and/or the power control system 501.

Figure 6:
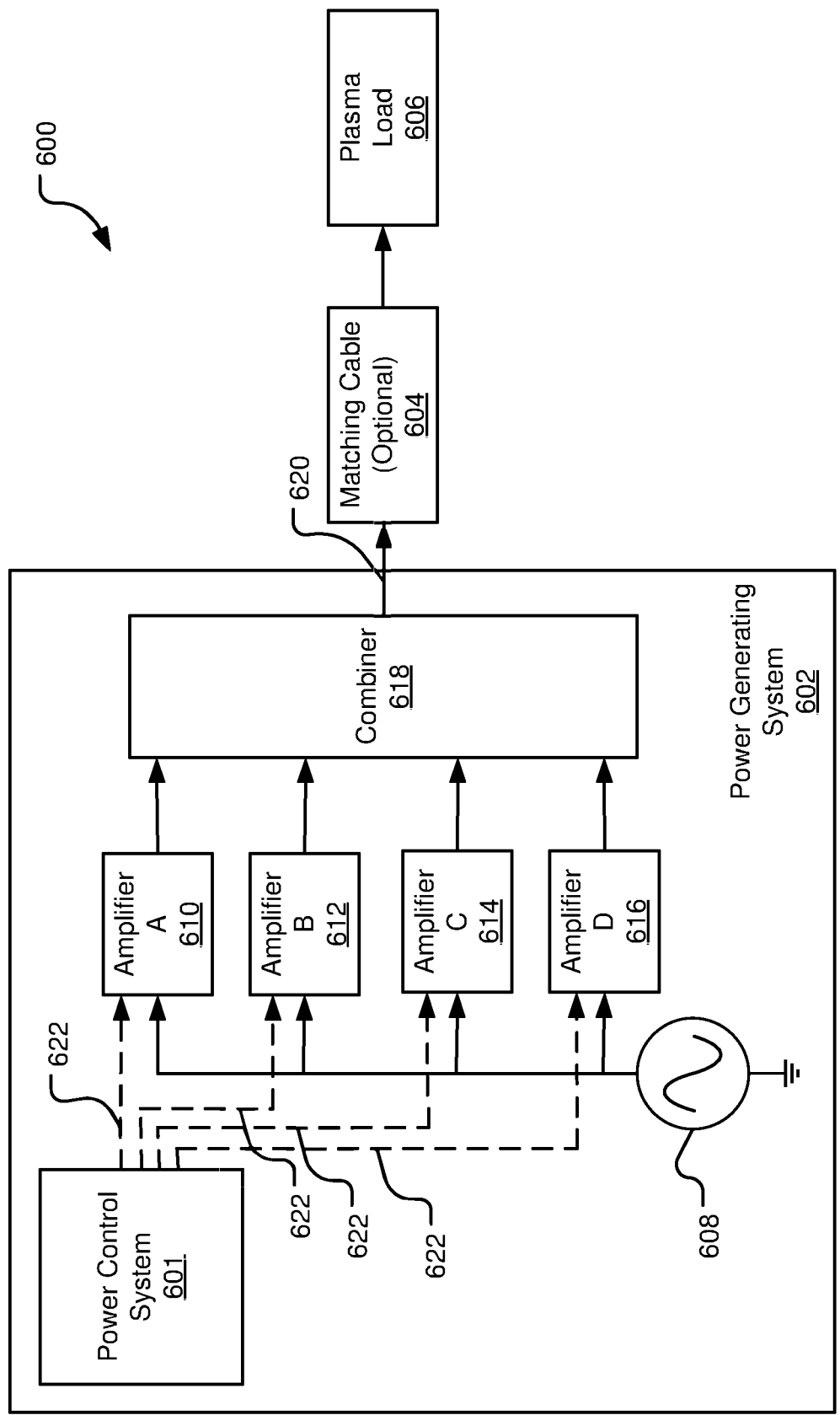
FIG. 6 illustrates a fourth example plasma processing system with a controllable quad-amplifier high efficiency power generator.

In yet another example, more than two amplifiers may be included in the power generating system 202 to provide even more control over the shape of the power profile of the combined output power signal. For example, FIG. 6 illustrates an example plasma processing system 600 with a controllable quad-amplifier high efficiency power generator 602. Similar to the above systems, the system 600 of FIG. 6 may include a power generating system 602 providing an output power signal to a plasma load 606. The power generating system 602 may include a power source 608 providing an input power signal to any number of amplifiers controlled by a power control system 601 through one or more power control signals 622. In the example shown, the power generating system 602 includes four amplifiers, amplifiers A-D 610-616. Although four amplifiers 610-616 are illustrated in the system 600, any number of amplifiers may be included in the power generating system 602 to provide additional control over the shape of the power profile signal provided by the power generating system 602.

Figure 7:
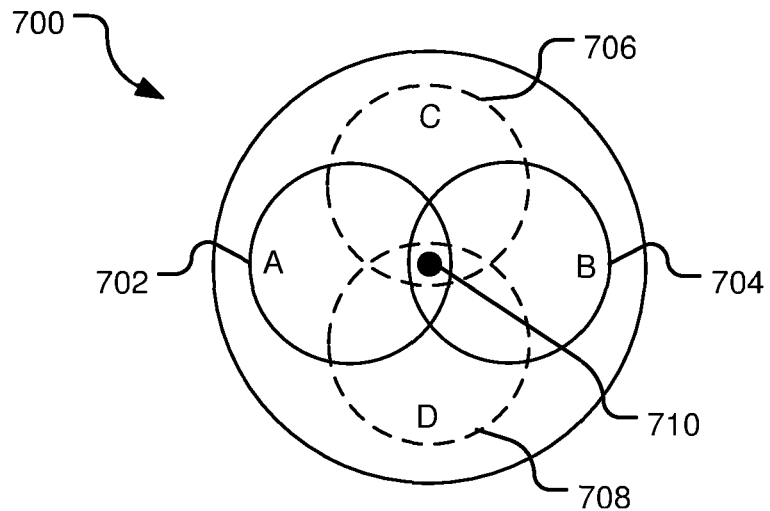
FIG. 7 is view of a simplified Smith chart of the power profiles of the output power signals from a quad-amplifier high efficiency power generator.

In some implementations, the four or more amplifiers 610-616 of the power generating system 602 may be paired such that control over one amplifier of a pair from the power control system 601 may affect control over the second amplifier of the pair. For example, amplifier A 610 and amplifier B 612 may be controlled by the power control system 601 such that the output signals from the amplifiers are diametrically opposite power profiles, as discussed above with relation to FIG. 2. A second pair of amplifiers, amplifier C 614 and amplifier D 616, may also be controlled such that their output power profiles are diametrically opposed (illustrated as rotated 90 degrees and 270 degrees in FIG. 6 relative to the output signal of amplifier A). Thus, the power profiles of the second pair of amplifiers 614, 616 may be rotated by 90 degrees on the Smith chart impedance plane in reference to the first pair of the power amplifies 610, 612. Output signals from all four amplifies 610-616 may be combined with the combiner 618 and provided to a plasma load 606 as discussed above. Such a configuration of combining output power signals of four power amplifiers 610-616 may provide four quadrant control of the source impedance of the output power signal or, in other terms, allows independent control of the value and direction of the slope of the output power profile. For example, FIG. 7 is a simple view of a Smith chart 700 of the power profiles of the output power signals from the four amplifiers 610-616 of the circuit of FIG. 6. Each output profile 702-708 may include a peak output power in a different quadrant of the Smith chart. For example, amplifier A 610 may have an output power profile in which a peak of the power profile occurs within the circle 702 illustrated in the chart 700. The peak power of the power profile of amplifier A 610 may thus occur within a first quadrant of the Smith chart 700. Similarly, amplifier B 612 may have an output power profile in which a peak of the power profile occurs within the circle 704 of the chart 700 in a different quadrant of the chart. The output power profiles 702, 704 of amplifier A 610 and amplifier B 612 may be diametrically opposed in reference to a nominal impedance 710 in the Smith chart, similar to the combined output power profile discussed above with reference to FIGS. 3 and 4. The output power profile 706 of amplifier C 614 may include a peak in yet a third quadrant of the Smith chart 700, with a diametrically opposed power profile 708 of amplifier D 616. The output power profiles of the pair of amplifier C 614 and amplifier D 616 may be rotated 90 degrees on the Smith chart in relation to the output power profiles of the pair of amplifier A 610 and amplifier B 612 to provide the power control system 601 four quadrant control in shaping the output power profile of the combined output power signal. Additional amplifiers included in the power generating system 602 may provide even more control over the combined output power signal. For purposes of illustration, the power profiles are each shown as uniform circles in the top view; however, other shapes are possible. Moreover, the profile of each power amplifier is shown as the same shape; however, it is possible for the profiles to define different shapes relatively.

Figure 8:
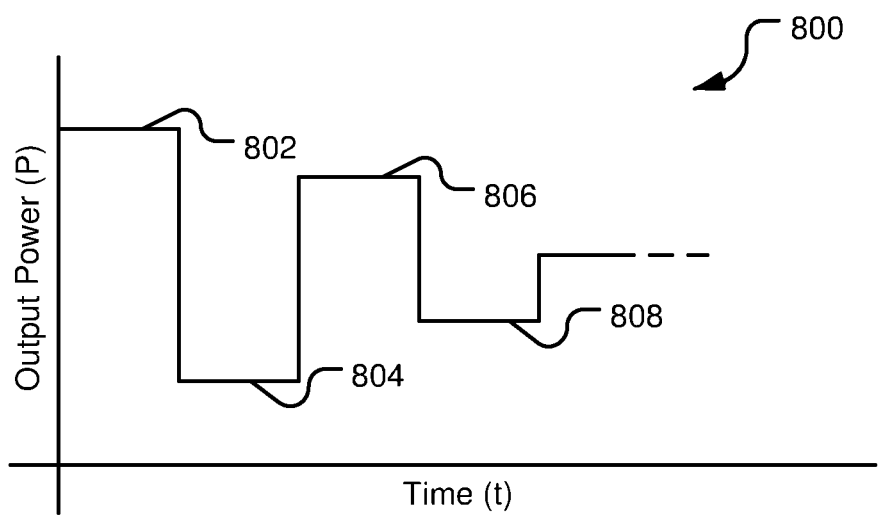
FIG. 8 is an example waveform of pulsed power applied to a load of a plasma processing system from a high efficiency radio frequency (RF) power generator.

Some plasma processing systems apply a pulsed power signal to the plasma chamber to ignite and control the plasma rather than a constant power signal. For example, FIG. 8 illustrates an example waveform of pulsed power signal 800 applied to a load 206 of a plasma processing system 200 from a high efficiency radio frequency (RF) power generator 202. The pulsed power signal 800 may include providing a high power signal 802 for a first duration, followed by a low power signal 804 for a second duration. In some instances, the high power signal 802 may include a positive voltage signal and the low power signal 804 may include a negative voltage signal, although any characteristics of the power signals may be used by the system 200 given that the high power signal is greater than the low power signal in the pulsed signal 800. In addition, the duration of the high power signal 802 and the low power signal 804 may be any length of time based on the condition of the system 200 and the intended effects on the plasma load 206. In still other instances, additional power levels 806, 808 may be provided to the load 206 from the power generating system 202 in the pulsed power signal 800 that may also be active for one or more durations.

The power generating system of the circuits described above may control the source impedance of a power signal provided to the load in a plasma processing system in response to the impedance of the load at the various power levels of the pulsed power signal 800. For example, the power generating system 202 of FIG. 2 may provide a pulsed power signal 800 similar to that illustrated in FIG. 8. As mentioned above, the load impedance may be correlated to a power signal provided by the power generating system 202 such that varying the input power to the load, as illustrated in the waveform 800 of FIG. 8, may vary the impedance of the load. As the load impedance varies in relation to the pulsed power waveform, the power generating system 202 may attempt to match a source impedance of the provided power signal to the load impedance. In one implementation, the power control system 201 may include a look-up table, database, or other reference data that provides a target source impedance to match the load impedance at a particular power level of the pulsed power signal. For example, the look-up table of the power control system 201 may include an entry associated with the initial power level 802 of the pulsed power signal. When the power generating system 202 provides the initial power level 802, the power control system 201 may control the amplifiers 210, 212 to provide a source impedance of the combined output power signal based on the information in the look-up table for the initial power level. Similarly, as the power generating system 202 provides the second power level 804 of the pulsed power signal, the power control system 201 may respond and control the amplifiers 210, 212 to provide a source impedance of the combined output power signal based on the information in the look-up table for the second power level. The power control system 201 may continue to reference to the look-up table to obtain a target source impedance for power level 806 and power level 808 of the pulsed power signal when those signals are provided to the load 206 from the power generating system 202. In this manner, the look-up table may provide the target source impedance for the combined power output signal for any power level of the provided power signal. The power control system 201 may then transmit corresponding control signals to the amplifiers 210, 212 of the power generating system 202 to generate the combined output power signal with the target source impedance accordingly.

In another implementation, the power control system 501 may respond and control the amplifiers 510, 512 of the power generating system 502 based on the feedback information received as an input to the system. Thus, the pulsed power signal 800 from the power generating system 502 may be provided to the feedback system 516 and a target source impedance for a current power level of the power signal may be determined and provided to the power control system 501. The power control system 501 may control the amplifiers 510, 512 as described above to generate the combined output power signal with the target source impedance based on the information received from the feedback system 516.

Figure 9:
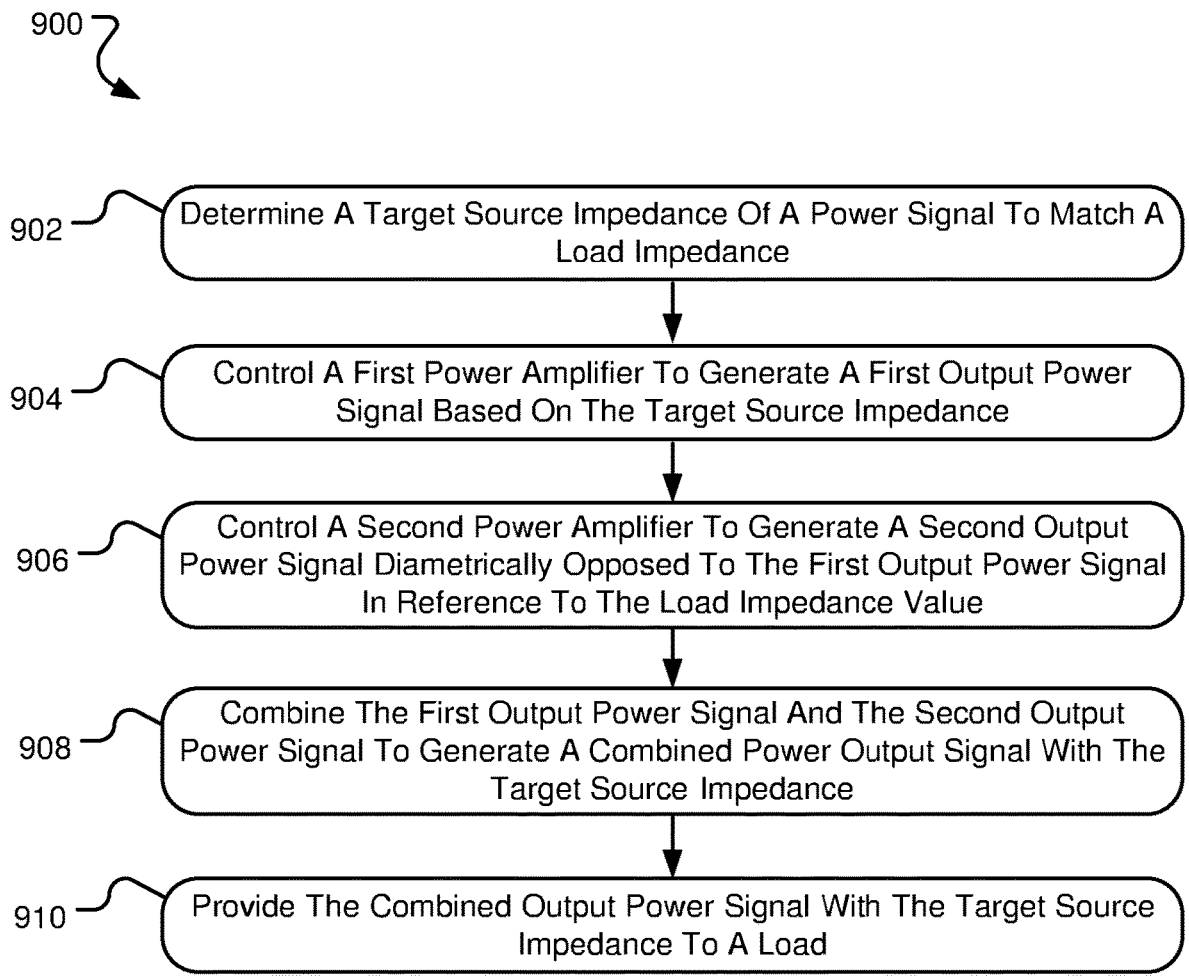
FIG. 9 is a flowchart of a method for controlling a plurality of amplifiers of power generating system to control a source impedance of an output power signal.

FIG. 9 is a flowchart of a method for controlling a plurality of amplifiers of power generating system to control a source impedance of an output power signal. The operations of the method 900 of FIG. 9 may be performed by the power generating systems described above. For example, the power control system 201, amplifier A 210, amplifier B 212, and/or combiner 214 may perform one or more of the operations described. The operations may also be performed by other components of the power generating system not discussed. The operations may be performed using software-related programs, hardware configured to perform aspects of the operations, or a combination of both software and hardware components.

Beginning in operation 902, the power generating system 202 may determine a target source impedance of a power signal to provide to a load that matches the load impedance. The target source impedance to match the load impedance may be generated in any manner described herein, including obtaining the target source impedance from a look-up table, receiving feedback information on a power signal provided to the load, receiving signal information from the load system, and the like. Further, the target source impedance may vary during operation of the system 200, such as when the load impedance varies due to operational conditions or changes occur in the power signal provided to the load.

In operation 904, the power control system 201 may control a first amplifier 210 to generate a first output power signal. The power control system 201 may provide one or more instructions to configure or instruct the first amplifier 210 to alter an input power signal according to the instructions. Similarly, in operation 906, the power control system 201 may control a second amplifier 212 to generate a second output power signal. The power control system 201 may provide one or more instructions to the second amplifier 212 to configure or instruct the second amplifier to alter an input power signal according to the instructions. The first output power signal and the second output power signal may be generated based on the target source impedance. For example and discussed above, the output power signal of the second amplifier 212 may be generated to be diametrically opposed to the output power signal of the first amplifier 210 such that the combination of the two power output signals may create a symmetrical or asymmetrical output power signal in reference to a nominal load impedance value. In addition, the shape of the power profile of the combined output power signal may be controlled by the magnitude (or other characteristics) of the output power signal of amplifier A 210 and/or amplifier B 212. The control over the output power signals from amplifier A 210 and/or amplifier B 212 may generate a combined power profile signal with a determined amplitude and slope of a source impedance corresponding to the target source impedance determined above.

Thus, in operation 908, the output power signal from amplifier A 210 may be combined with the output power signal from amplifier B 212. The combined output power signal may have a source impedance similar to the target source as determined by the power generating system 202. The source impedance of the combined power signal may match the load impedance of the load system 206 to stabilize the operation of the system 200. In general, any characteristic of the combined output power signal may be controlled by the power control system 201, including the magnitude, frequency, and phase of the output signal based on the target source impedance. Further, the output power signals from amplifier A 210 and amplifier B 212 may be combined using a combiner circuit or device. In operation 910, the combined output power signal with the target source impedance may be provided or transmitted to a load corresponding to the load impedance determined above. The operations of the method 900 of FIG. 9 may be repeated during operation of the system 200 to adjust the source impedance of the power signal to match or attempt to match the load impedance in real-time, thereby generating a more stable and efficient power signal for operating the system.

The description above includes example systems, methods, techniques, instruction sequences, and/or computer program products that embody techniques of the present disclosure. However, it is understood that the described disclosure may be practiced without these specific details.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium (e.g., hard disk drive), optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

Figure 10:
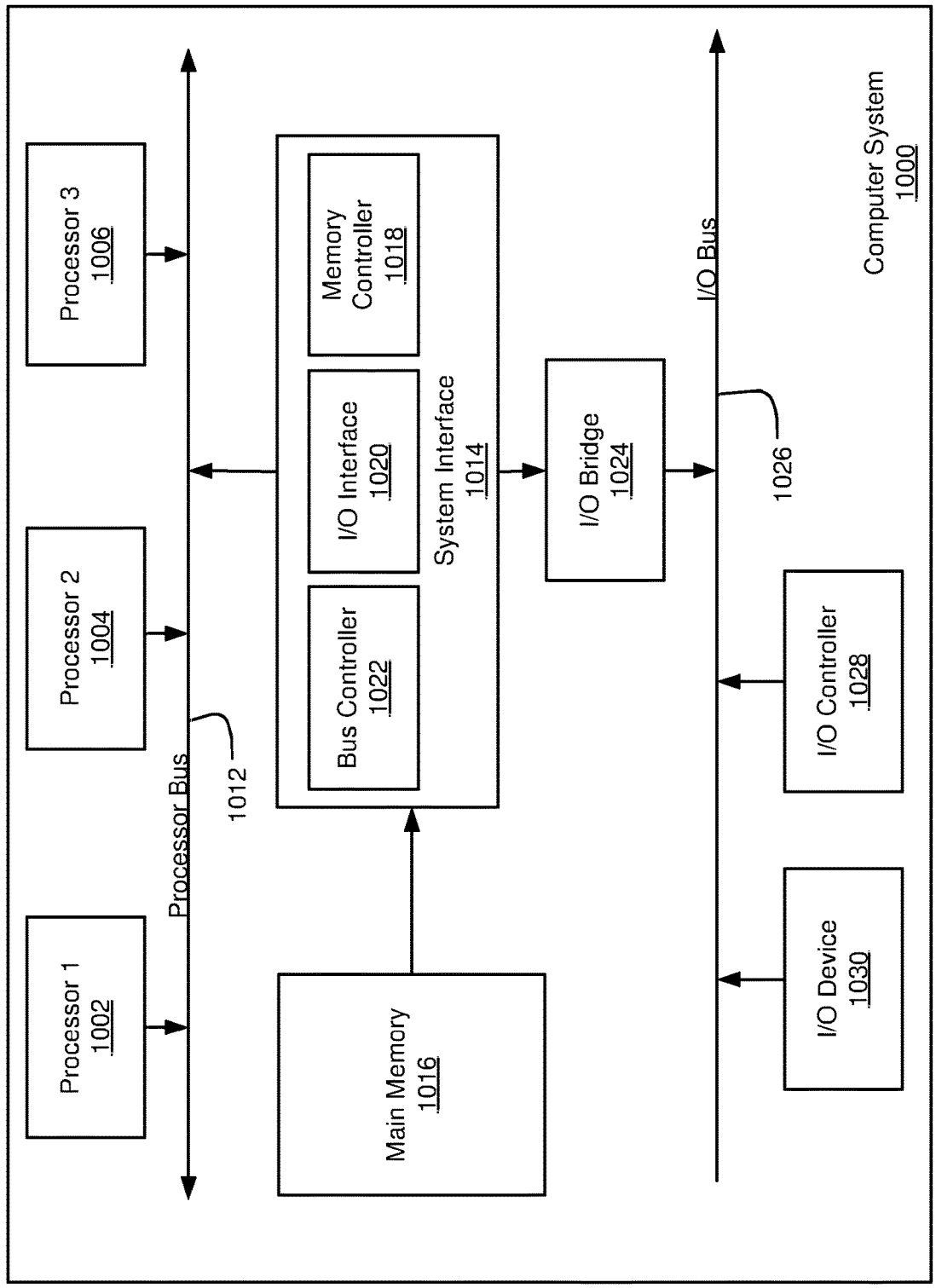
FIG. 10 illustrates an example computer system according to one embodiment of the present disclosure.

For example, FIG. 10 is a block diagram illustrating an example of a host or computer system 1000 which may be used in implementing the embodiments of the present disclosure, such as the controller 116 as shown in FIG. 3B. The computer system (system) includes one or more processors 1002-1006. Processors 1002-1006 may include one or more internal levels of cache (not shown) and a bus controller or bus interface unit to direct interaction with the processor bus 1012. Processor bus 1012, also known as the host bus or the front side bus, may be used to couple the processors 1002-1006 with the system interface 1014. System interface 1014 may be connected to the processor bus 1012 to interface other components of the system 1000 with the processor bus 1012. For example, system interface 1014 may include a memory controller 1013 for interfacing a main memory 1016 with the processor bus 1012. The main memory 616 typically includes one or more memory cards and a control circuit (not shown). System interface 1014 may also include an input/output (I/O) interface 1020 to interface one or more I/O bridges or I/O devices with the processor bus 1012. One or more I/O controllers and/or I/O devices may be connected with the I/O bus 626, such as I/O controller 1028 and I/O device 1030, as illustrated.

I/O device 1030 may also include an input device (not shown), such as an alphanumeric input device, including alphanumeric and other keys for communicating information and/or command selections to the processors 1002-1006. Another type of user input device includes cursor control, such as a mouse, a trackball, or cursor direction keys for communicating direction information and command selections to the processors 1002-1006 and for controlling cursor movement on the display device.

System 1000 may include a dynamic storage device, referred to as main memory 1016, or a random access memory (RAM) or other computer-readable devices coupled to the processor bus 1012 for storing information and instructions to be executed by the processors 1002-1006. Main memory 1016 also may be used for storing temporary variables or other intermediate information during execution of instructions by the processors 1002-1006. System 1000 may include a read only memory (ROM) and/or other static storage device coupled to the processor bus 1012 for storing static information and instructions for the processors 1002-1006. The system set forth in FIG. 10 is but one possible example of a computer system that may employ or be configured in accordance with aspects of the present disclosure.

According to one embodiment, the above techniques may be performed by computer system 1000 in response to processor 1004 executing one or more sequences of one or more instructions contained in main memory 1016. These instructions may be read into main memory 1016 from another machine-readable medium, such as a storage device. Execution of the sequences of instructions contained in main memory 1016 may cause processors 1002-1006 to perform the process steps described herein. In alternative embodiments, circuitry may be used in place of or in combination with the software instructions. Thus, embodiments of the present disclosure may include both hardware and software components.

A computer readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 1016. Common forms of machine-readable medium may include, but is not limited to, magnetic storage medium (e.g., hard disk drive); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various operations or steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages.

The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A power generating system comprising:
   an RF power supply to provide an RF power signal;
   a first power amplifier configured to receive the RF power signal and a control instruction, and the first power amplifier is configured, based upon the control instruction, to alter the RF power signal to provide a first controllable output power;
   a second power amplifier configured to provide a second output power;
   a combiner configured to combine the first controllable output power with the second output power to apply a combined output power signal; and
   a power control system configured to provide the control instruction to the first power amplifier to configure the first power amplifier to adjust the first controllable output power to adjust a source impedance of the power generating system.

2. The power generating system of claim 1, wherein a second asymmetrical power profile of the second power amplifier is diametrically opposed to a first asymmetrical power profile of the first power amplifier.

3. The power generating system of claim 1, wherein the power control system is configured to adjust the source impedance based on an impedance of a load to which the combined output power signal is applied.

4. The power generating system of claim 3, wherein the combined output power signal has a combined output power profile comprising a peak power, wherein the power control system is configured to adjust the first controllable output power so the peak power of the combined output power profile corresponds with the impedance of the load.

5. The power generating system of claim 4, wherein a magnitude of the first controllable output power comprises a first magnitude that is different than a second magnitude of the second output power so the combined output power signal has an asymmetrical power output profile in reference to the impedance of the load.

6. The power generating system of claim 1, further comprising: a feedback circuit adapted to determine a characteristic of the combined output power signal and provide the characteristic of the combined output power to the power control system, wherein the power control system is configured to adjust the first controllable output power based on the characteristic of the combined output power signal.

7. The power generating system of claim 6, wherein the characteristic of the combined output power comprises a phase of the combined output power.

8. A plasma processing system comprising:
   a plasma processing chamber; and
   a power generating system coupled to the plasma processing chamber, the power generating system comprising:
   an RF power supply to provide an RF power signal;
   a first power amplifier configured receive the RF power signal and a control instruction, and the first power amplifier is configured, based upon the control instruction, to alter the RF power signal to provide a first output power;
   a second power amplifier configured to provide a second output power;
   a combiner configured to combine the first output power with the second output power to apply a combined output power signal; and
   means for changing a source impedance of the power generating system by providing the control instruction to configure the first power amplifier to change a ratio of the first output power to the second output power.

9. The plasma processing system of claim 8, wherein a second asymmetrical power profile of the second power amplifier is diametrically opposed to a first asymmetrical power profile of the first power amplifier.

10. The plasma processing system of claim 8, wherein the means for changing the source impedance is configured to adjust the source impedance based on an impedance of a plasma load of the plasma processing chamber.

11. The plasma processing system of claim 10, wherein the combined output power signal has a combined output power profile comprising a peak power, wherein the means for changing comprises means for adjusting the first output power so the peak power of the combined output power profile corresponds with the impedance of the plasma load.

12. The plasma processing system of claim 11, wherein a magnitude of the first output power comprises a first magnitude that is different than a second magnitude of the second output power so the combined output power signal has an asymmetrical power output profile in reference to the impedance of the plasma load.

13. The plasma processing system of claim 8, wherein the means for changing comprises means for determining a characteristic of the combined output power signal and means for adjusting the first output power based on the characteristic of the combined output power signal.

14. A non-transitory processor-readable memory comprising instructions that, when executed by the processor, are operable to adjust a source impedance of an output signal of a power generating system, the instructions including instructions to:
   cause an RF power supply to provide an RF power signal to a first amplifier of the power generating system and a second amplifier of the power generating system;
   provide a first power signal with a first power profile with a first amplifier of the power generating system;
   provide a second power signal with a second power profile with a second amplifier of the power generating system; and
   in response to a measurement indicative of a load impedance, provide a control instruction to configure at least one of the first amplifier to adjust the first power signal or configure the second amplifier to adjust the second power signal to define a combined output power signal based, at least, on the measurement indicative of a load impedance.

15. The non-transitory processor-readable memory of claim 14 further comprising instructions to:
   adjust the at least one of the first power signal or the second power signal such that a peak power of the combined power profile is based, at least, on the measurement indicative of the load impedance.

16. The non-transitory processor-readable memory of claim 15 further comprising instructions to:
adjust the at least one of the first power signal or the second power signal such that the peak power of the combined power profile is based to match a source impedance of the combined output power signal to the measurement indicative of the load impedance.

17. The non-transitory processor-readable memory of claim 14, further comprising instructions to:
transmit, by a controller and to the first amplifier or the second amplifier, at least one instruction to cause the first amplifier or the second amplifier to alter a respective input power signal.

* * * * *